United States Patent
Hafez et al.

(10) Patent No.: US 9,159,734 B2
(45) Date of Patent: Oct. 13, 2015

(54) ANTIFUSE ELEMENT UTILIZING NON-PLANAR TOPOLOGY

(75) Inventors: Walid M. Hafez, Portland, OR (US); Chia-Hong Jan, Portland, OR (US); Curtis Tsai, Beaverton, OR (US); Joodong Park, Portland, OR (US); Jeng-Ya D. Yeh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 176 days.

(21) Appl. No.: 13/976,087

(22) PCT Filed: Oct. 18, 2011

(86) PCT No.: PCT/US2011/056760
§ 371 (c)(1),
(2), (4) Date: Jun. 26, 2013

(87) PCT Pub. No.: WO2013/058746
PCT Pub. Date: Apr. 25, 2013

(65) Prior Publication Data
US 2013/0270559 A1    Oct. 17, 2013

(51) Int. Cl.
*H01L 29/00* (2006.01)
*H01L 29/76* (2006.01)
(Continued)

(52) U.S. Cl.
CPC .. *H01L 27/11206* (2013.01); *H01L 21/823821* (2013.01); *H01L 23/5252* (2013.01); *H01L 27/0924* (2013.01); *H01L 29/7853* (2013.01)

(58) Field of Classification Search
CPC ............ H01L 29/66795; H01L 23/5252; H01L 29/785; H01L 27/11206; H01L 29/7853; H01L 21/823431; H01L 27/0924; H01L 21/823821

USPC ............ 257/E23.147, 530, 529, 401
See application file for complete search history.

(56) References Cited

U.S. PATENT DOCUMENTS 5,557,136 A   9/1996   Gordon et al.
5,572,062 A   11/1996  Iranmanesh
(Continued)

FOREIGN PATENT DOCUMENTS

WO   2004/059726 A1   7/2004
WO   2013/058746 A1   4/2013

OTHER PUBLICATIONS

International Preliminary Report on Patentability received for PCT Patent Application No. PCT/US2011/056760, mailed on May 1, 2014, 7 pages.
(Continued)

*Primary Examiner* — Shouxiang Hu
(74) *Attorney, Agent, or Firm* — Finch & Maloney PLLC

(57) ABSTRACT

Techniques for providing non-volatile antifuse memory elements and other antifuse links are disclosed herein. In some embodiments, the antifuse memory elements are configured with non-planar topology such as FinFET topology. In some such embodiments, the fin topology can be manipulated and used to effectively promote lower breakdown voltage transistors, by creating enhanced-emission sites which are suitable for use in lower voltage non-volatile antifuse memory elements. In one example embodiment, a semiconductor antifuse device is provided that includes a non-planar diffusion area having a fin configured with a tapered portion, a dielectric isolation layer on the fin including the tapered portion, and a gate material on the dielectric isolation layer. The tapered portion of the fin may be formed, for instance, by oxidation, etching, and/or ablation, and in some cases includes a base region and a thinned region, and the thinned region is at least 50% thinner than the base region.

23 Claims, 9 Drawing Sheets

(51) Int. Cl.
*H01L 29/94* (2006.01)
*H01L 27/112* (2006.01)
*H01L 23/525* (2006.01)
*H01L 21/8238* (2006.01)
*H01L 27/092* (2006.01)
*H01L 29/78* (2006.01)

(56) References Cited

U.S. PATENT DOCUMENTS

| | | | |
|---|---|---|---|
| 5,915,171 | A | 6/1999 | Sheu |
| 6,130,469 | A | 10/2000 | Bracchitta et al. |
| 7,427,779 | B2 | 9/2008 | Damlencourt et al. |
| 7,569,443 | B2 | 8/2009 | Kavalieros et al. |
| 7,601,570 | B2 | 10/2009 | Damlencourt |
| 2005/0095763 | A1 | 5/2005 | Samavedam et al. |
| 2005/0179030 | A1* | 8/2005 | Seo et al. ............... 257/20 |
| 2005/0253203 | A1 | 11/2005 | Liaw |
| 2005/0282342 | A1 | 12/2005 | Adan |
| 2008/0157130 | A1 | 7/2008 | Chang |

OTHER PUBLICATIONS

Kavalieros et al.,"Tri-Gate Transistor Architecture with High-k Gate Di electrics, Metal Gates and Strain Engineering", 2006 Symposium on VLSI Technology Digest of Technical Papers, pp. 50-51.
International Search Report and Written Opinion received for PCT Patent Application No. PCT/US2011/056760, mailed on May 18, 2012, 10 pages.
Balakumar, et al., "Germanium-Rich SiGe Nanowires Formed Through Oxidation of Patterend SiGe FINS on Insulator," Journal of Electronic Materials, vol. 38, No. 3, Jan. 9, 2009, pp. 443-448.
Balakumar, et al., "SiGe amorphization during Ge condensation in silicon germanium on insulator," Applied Physics Letters 89, Published online: Jul. 28, 2006, pp. 042115-1 to 042115-3.
Balakumar, et al., "SiGeO layer formation mechanism at the SiGe/oxide interfaces during Ge condensation," Applied Physics Letters 90, Published online: Jan. 19, 2007, pp. 032111-1 to 03211-3.
Hariharan, "EEs801 Seminar report FinFETs," Electrical Engineering Dept. IIT Bombay, Apr. 28, 2005, 25 pages.
Balakumar, et al., "Effects of Annealing and Temperature on SGOI Fabrication Using Ge Condensation," Proceedings of 13th IPFA 2006, Singapore, pp. 150-153.
Yan, "Study of Si1-xGex Junction Formation for SOI Based CMOS Technology," A dissertation submitted to the Graduate Faculty of North Carolina State University, Dec. 2007, 119 pages.
Balakumar, et al., "Fabrication of high Ge content SiGe layer on Si by Ge condensation technique," Procedings of 13th IPFA 2006, Singapore, pp. 301-305.
Zangenberg, et al., "Ge Self-Diffusion in Epitaxial Si1-xGex Layers," Physical Review Letters, vol. 87, No. 12, Sep. 17, 2001, pp. 125901-1 to 125901-4.
Shimura, "Self-limiting oxidation of SiGe alloy on silicon-on-insulator wafers," Applied Physics Letters 89, Published online: Sep. 15, 2006, pp. 111923-1 to 111923-3.
International Search Report & Written Opinion received for PCT Application No. PCT/US2002/041182, mailed Mar. 20, 2003, 2 pages.

* cited by examiner

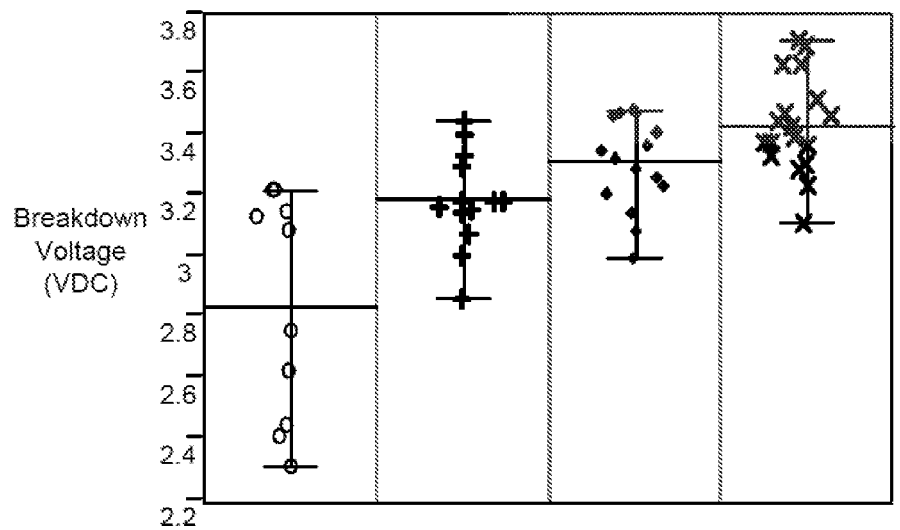
Fig. 3a
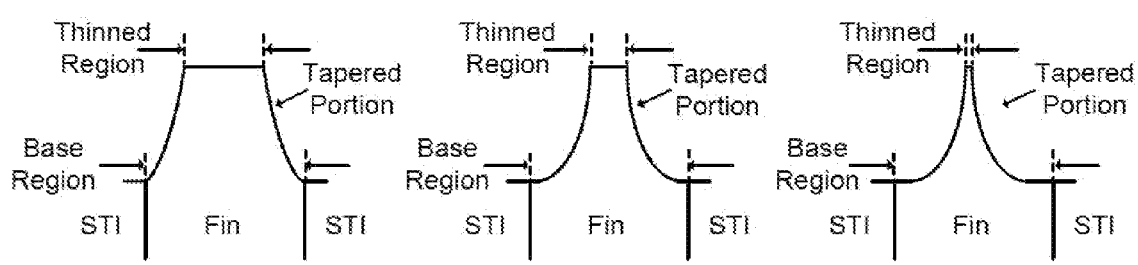
Fig. 3b　　　　　Fig. 3c　　　　　Fig. 3d

ANTIFUSE ELEMENT UTILIZING NON-PLANAR TOPOLOGY

BACKGROUND

Metal fuse and antifuse arrays are commonly used for non-volatile, complementary metal oxide semiconductor (CMOS) compatible storage. For example, programmable memory devices such as programmable read-only memory (PROM) and one-time programmable read-only memory (OTPROM) are typically programmed by either destroying links (via a fuse) or creating links (via an antifuse) within the memory circuit. In PROMs, for instance, each memory location or bitcell contains a fuse and/or an antifuse, and is programmed by triggering one of the two. The programming is usually done after manufacturing of the memory device, and with a particular end-use or application in mind. Once conventional bitcell programming is performed, it is generally irreversible.

Fuse links are commonly implemented with resistive fuse elements that can be open-circuited or 'blown' with an appropriate amount of high-current. Antifuse links, on the other hand, are implemented with a thin barrier layer of non-conducting material (such as silicon dioxide) between two conductor layers or terminals, such that when a sufficiently high voltage is applied across the terminals, the silicon dioxide or other such non-conducting material is effectively turned into a short-circuit or otherwise low resistance conductive path between the two terminals. Conventional antifuse links for use in programming memory are associated with a number of non-trivial issues.

BRIEF DESCRIPTION OF THE DRAWINGS

FIG. 3a demonstrates how the breakdown voltage of the FinFET antifuse transistor structure can be modulated by the fin topology, in accordance with example embodiments of the present invention.

FIGS. 3b-3d illustrate example FinFET antifuse transistor structure fin topologies configured in accordance with an example embodiment of the present invention.

As will be appreciated, the figures are not necessarily drawn to scale or intended to limit the claimed invention to the specific configurations shown. For instance, while some of the figures generally indicate straight lines, right angles, and smooth surfaces, an actual implementation of an antifuse structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques for providing non-volatile antifuse memory elements and other antifuse links are disclosed herein. In some embodiments, the antifuse memory elements are configured with non-planar topology such as FinFET topology. In some such embodiments, the fin topology can be manipulated and used to effectively promote lower breakdown voltage transistors, by creating enhanced-emission sites which are suitable for use in lower voltage non-volatile antifuse memory elements. Note, however, that numerous other semiconductor antifuse element applications will be apparent in light of this disclosure, and the claimed invention is not intended to be limited to memory applications.

General Overview

Figure 1:
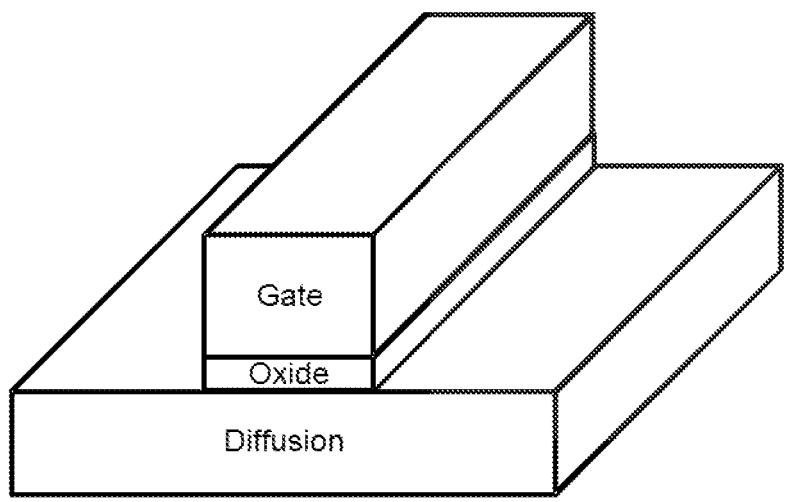
FIG. 1 illustrates a perspective view of a typical planar antifuse transistor structure.

As previously noted, conventional antifuse links for use in programming memory are associated with a number of non-trivial issues. For instance, one-time-programmable (OTP) memory arrays are typically constructed using polysilicon fuses, metal fuses, and oxide antifuses. Polysilicon and metal fuse arrays traditionally have larger footprints than oxide antifuse arrays, in part due to the large current required to fuse the element (e.g., 10's of mA of current). Oxide antifuses currently rely on a gate oxide coupled with a gate electrode to form the fusing element, and are typically constructed on planar technologies, such as the one shown in FIG. 1, which generally includes a diffusion layer for the source and drain regions, and a gate formed on top of the diffusion layer and insulated therefrom by an oxide layer. As can be seen, the oxide breakdown of the antifuse structure has an equal probability of occurring anywhere under the gate in such planar topology.

In addition, increasing digital rights management and security requirements generally necessitate large arrays of encrypted read-only memory (e.g., such as High-bandwidth Digital Content Protection or HDCP keys) for digital set-top boxes and other such protected-content devices. The required number of antifuse elements to be supported in a given typical code-storage or digital security application has grown from 10's of bits in previous generations, to projected sizes of 10's of Mbits for future generations. Such large storage arrays implicate a substantial die size penalty when implemented with conventional antifuse architectures. Additionally, the power required to successfully program such antifuse elements increases the circuit complexity, and power consumption itself increases.

In contrast to conventional planar antifuse structures, an embodiment of the present invention employs a non-planar FinFET antifuse topology. By utilizing the geometry of a FinFET transistor architecture, the voltage needed to create hard breakdown of the transistor can be reduced, which is suitable for anti-fuse memory operation. In particular, the FinFET antifuse topology can be used to create or otherwise enhance high electric field regions in the gate isolation dielectric, which in turn act to lower the breakdown voltage of the antifuse element. A FinFET is a transistor built around a thin strip of semiconductor material (generally referred to as the fin). The transistor includes the standard field effect transistor (FET) nodes, including a gate, a gate isolation dielectric, and source and drain regions. The conductive channel of the device resides within the fin beneath the gate isolation dielectric. Specifically, current runs along both sidewalls of the fin (sides perpendicular to the substrate surface) as well as along the top of the fin (side parallel to the substrate surface). Because the conductive channel of such configurations essentially resides along the three different outer planar regions of the fin, such a FinFET design is sometimes referred to as a trigate FinFET. Other types of FinFET and non planar configurations can also be used to implement an embodiment of the present invention as will be appreciated in light of this disclosure, such as double-gate FinFETs, in which the conductive channel principally resides along the two sidewalls of the fin structure.

In accordance with one such example embodiment, the fin width of the FinFET transistor is modulated or otherwise shaped such that a high electric field is created at a top or upper portion of the fin, favorably lowering the breakdown of the fuse element. In other embodiments, the high electric field is created at a middle portion or a lower portion of the fin. In still other embodiments, the high electric field can be created at a combination of two or more top, middle, and lower portions of the fin. Any number of fin modulation schemes can be used, so long as an operable short circuit can be formed at a desired breakdown voltage (or within some desired range breakdown voltage). In this sense, the transistor fin/diffusion shape can be modified to create desired emission sites. Such optimizations are not possible on standard planar transistor architectures.

The fin can be shaped in a number of ways. In one specific example embodiment, a thick thermal native oxide is grown on a silicon fin structure which creates a geometry where the top of the fin effectively gets pinched or otherwise narrows due to silicon consumption during the formation of silicon dioxide ($SiO_2$). This pinching/narrowing of the diffusion/fin widths and lengths locally reduces the breakdown voltage of that particular structure, thereby providing an enhanced emission antifuse element in accordance with an embodiment of the present invention. In other embodiments, the desired fin shape may be provided, for example, by etching or laser trimming. In a more general sense, any suitable shaping technique that will selectively narrow the fin to a desired degree can be used.

FinFET Antifuse Structure

Figure 2A:
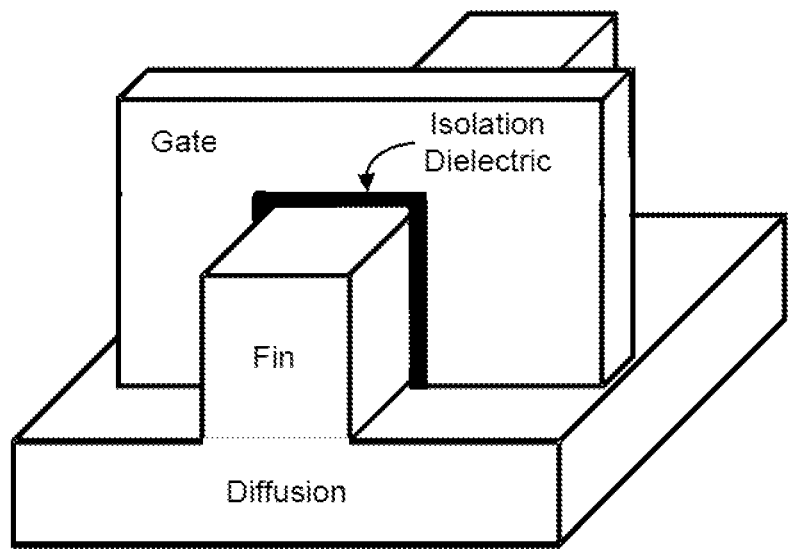
FIGS. 2a and 2b each illustrates a perspective view of a FinFET antifuse transistor structure configured in accordance with an example embodiment of the present invention.
Figure 2B:
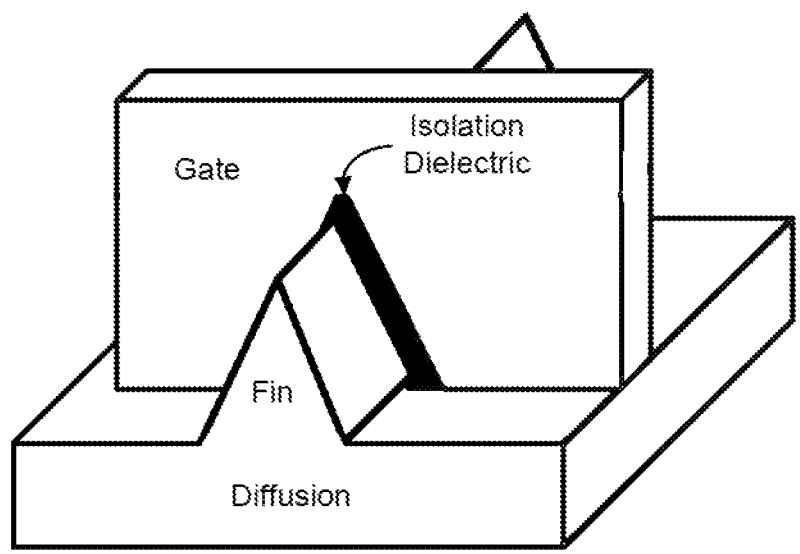

FIGS. 2a and 2b each illustrates a perspective view of a FinFET antifuse transistor structure configured in accordance with an example embodiment of the present invention. Each structure generally includes the standard FET nodes, including a gate, a gate isolation dielectric, and a diffusion area (for the source and drain regions) configured with a fin as shown. As previously explained, the conductive channel of the device may reside on the outer sides of the fin beneath the gate isolation dielectric, which may generally include two or three sides of the fin. In general, the breakdown voltage of each FinFET antifuse transistor structure depends on the thickness of the fin itself in this sense, the antifuse structure shown in FIG. 2a is configured with a fin having an untapered upper portion and has a higher breakdown voltage, while the structure shown in FIG. 2b is configured with a fin having a tapered upper portion and has a relatively lower breakdown voltage. As explained herein, the degree of tapering can be adjusted to provide the desired breakdown voltage.

The diffusion material can be any suitable semiconductor material, such as, for example, silicon or silicon germanium. The source and drain regions can be doped as typically done. For instance, in some cases the source and drain regions can be formed using either an implantation/diffusion process or an etching/deposition process. In the former process, dopants such as boron, aluminum, antimony, phosphorous, or arsenic may be ion-implanted into the substrate to form the source and drain regions. The ion implantation process is typically followed by an annealing process that activates the dopants and causes them to diffuse further into the substrate. In the latter process, the substrate may first be etched to form recesses at the locations of the source and drain regions. An epitaxial deposition process may then be carried out to fill the recesses with a silicon alloy such as silicon germanium or silicon carbide, thereby forming the source and drain regions. In some implementations the epitaxially deposited silicon alloy may be doped in situ with dopants such as boron, arsenic, or phosphorous. In further implementations, alternate materials may be deposited into the recesses to form the source and drain regions, such as germanium or a group III-V material or alloy. The gate isolation dielectric can be, for example, any suitable oxide such as $SiO_2$ or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In some specific example embodiments, the high-k gate dielectric layer may have a thickness in the range of 5 Å to around 100 Å thick (e.g., 10 Å). In other embodiments, the gate dielectric layer may have a thickness of one monolayer of oxide material. In general, the thickness of the gate isolation dielectric should be sufficient to electrically isolate the gate electrode from the neighboring source and drain contacts, until the desired breakdown (or programming) voltage is reached. In some embodiments, additional processing may be performed on the high-k gate dielectric layer, such as an annealing process to improve the quality of the high-k material. The gate material can be, for example, polysilicon, silicon nitride, silicon carbide, or a metal layer (e.g., tungsten, titanium nitride, tantalum, tantalum nitride) although other suitable gate electrode materials can be used as well. The gate material, which may be a sacrificial material that is later removed for a replacement metal gate (WAG) process, has a thickness in the range of 10 Å to 500 Å (e.g., 100 Å), in some example embodiments. Each of the gate isolation dielectric and gate materials may be deposited using, for example, conventional deposition processes such as chemical vapor deposition (CVD), atomic layer deposition (ALD), spin-on deposition (SOD), or physical vapor deposition (PVD). Alternate deposition techniques may be used as well, for instance, the gate isolation dielectric and gate materials may be thermally grown. As will be appreciated in light of this disclosure, any number of other suitable materials, geometries, and formation processes can be used to implement an embodiment of the present invention, so as to provide an enhanced antifuse device as described herein.

In one example embodiment, by performing an oxidation of the fin shown in FIG. 2a, and prior to the gate formation, the tapered fin structure shown in FIG. 2b can be created. The narrowing of the fin/diffusion (e.g., resulting from silicon consumption during the oxidation process) creates an emission point at the top of the fin. In other example embodiments, the tapered fin structure is provided by selectively etching (e.g., wet and/or dry etch process) at least a portion of the fin. In some example embodiments, the more abrupt fin topology effectively decreases the breakdown voltage by 20% or more, which translates to higher antifuse array programming yield at lower voltage/power. A scanning electron microscopy (SEM) or transmission electron microscopy (TEM) cross section can be used to show the shaped fin topology to provide enhanced breakdown capability as described herein.

Experimental data was collected where the fin width was systematically reduced. This data is reflected in FIG. 3a, which demonstrates how the breakdown voltage of the FinFET antifuse transistor structure can be modulated by the fin topology, in accordance with example embodiments of the present invention. As can be seen, the variability plot of FIG. 3a shows the monotonic decrease in transistor breakdown voltage from the widest fin (rightmost group, having an average breakdown voltage of about 3.5 volts) to the narrowest fin (leftmost grouping having a breakdown voltage of about 2.8). In these examples, about a 20% reduction in the required voltage to short the gate to substrate was observed. This localized reduction in breakdown voltage can be used to enhance the oxide antifuse array programmability and reduce the circuitry overhead to construct a memory array.

FIGS. 3b-3d illustrate example FinFET antifuse transistor structure fin topologies configured in accordance with an example embodiment of the present invention. As can be seen, each fin has a tapered portion that extends from the shallow trench isolation (STI), with each tapered portion including a base region and a thinned region. The FinFET antifuse transistor structure shown in FIG. 3b has a thinned region that is about 50% thinner than the base region. As can be further seen, the FinFET antifuse transistor structure shown in FIG. 3c has a thinned region that is about 75% thinner than the base region, and the FinFET antifuse transistor structure shown in FIG. 3d has a thinned region that is about 90% (or more) thinner than the base region. The curved nature of the taper in these examples is generally a function of the thermal oxidation process used to cause the thinning. In other embodiments, the tapering may be more abrupt and angular, such as when formed or otherwise refined by an etch process. A combination of oxidation and/or etch processes can be used to provide any number of desired fin shapes (e.g., hour glass shape where middle portion of fin is thinned, a beaded necklace shape where there are multiple thinned points along the fin, etc).

Thus, one embodiment of the present invention allows a scalable, low power, nonvolatile antifuse memory element to be integrated into, for example, a high-k/metal gate non-planar CMOS process technology. Such an embodiment can be used, for instance, in any number of applications where a nonvolatile memory element is needed. In a more general sense, an embodiment of the present invention can be used in any integrated circuit application where an antifuse element is employed.

Methodology

Figure 4:
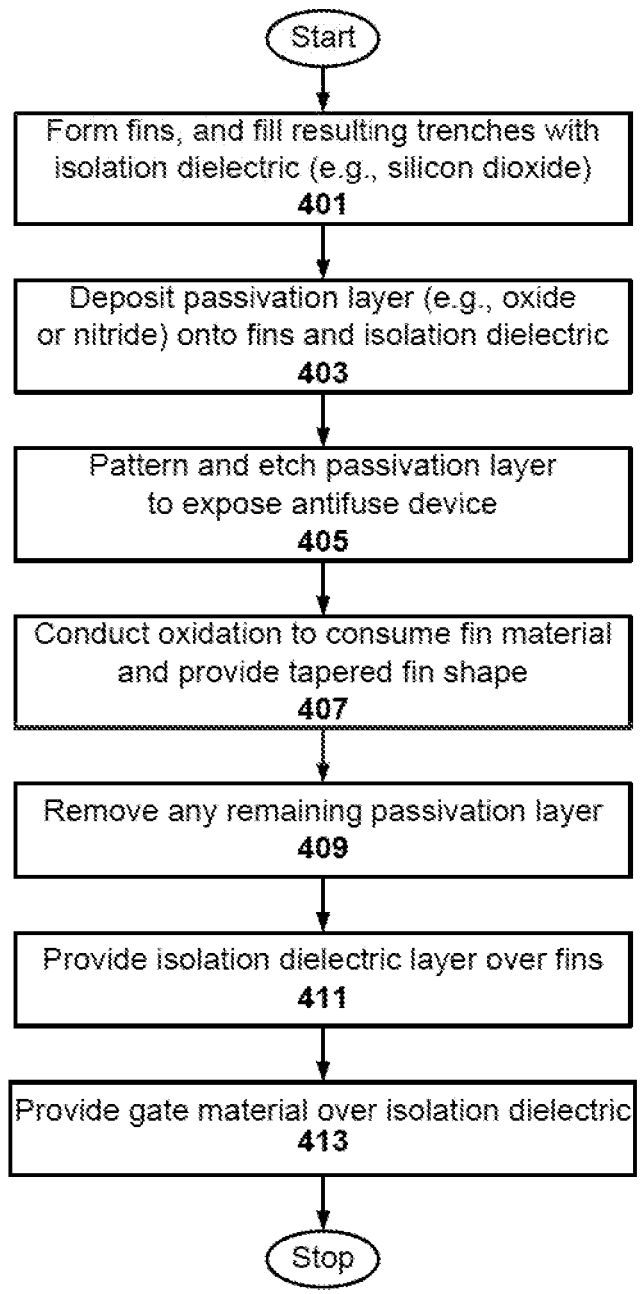
FIG. 4 illustrates a method for fabricating a FinFET antifuse transistor structure in accordance with an example embodiment of the present invention.

FIG. 4 illustrates a method for fabricating a FinFET antifuse transistor structure in accordance with an example embodiment of the present invention. FIGS. 5-16 show corresponding structures that will be referred to with reference to the method. Numerous variations will be apparent in light of this disclosure, and the claimed invention is not intended to be limited to any particular process or configuration.

Figure 5:
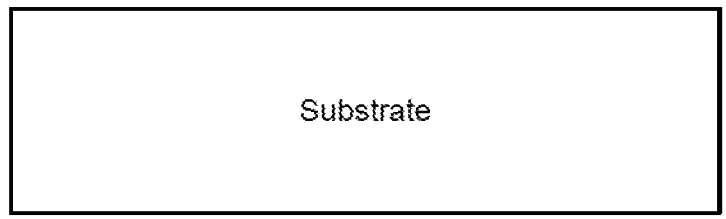
FIGS. 5-16 illustrate example structures resulting from carrying out the method of FIG. 4, configured in accordance with an example embodiment of the present invention.

The method includes forming one or more fins, and filling 401 the resulting trenches with isolation dielectric (e.g., $SiO_2$). The formation of the fins and isolation dielectric can be carried out in a number of ways. In one example embodiment, the fins and isolation dielectric are formed as shown in FIGS. 5 through 10, each of which shows a cross-sectional side view, wherein the cross-section is parallel to the fins. As can be seen in FIG. 5, a substrate is provided. The substrate can be, for example, a blank substrate that is to be prepared for subsequent semiconductor processes by forming a number of fin structures therein. Alternatively, the substrate can be a partially formed semiconductor structure upon which, for instance, drain, source, and gate regions are to be formed using at least one fin structure. Any number of suitable substrates can be used here, including bulk substrates, semiconductors on insulator substrates (XOI, where X is a semiconductor material such as Si, Ge or Ge-enriched Si), and multi-layered structures, and particularly those substrates upon which fins are formed prior to a subsequent gate patterning process. In one specific example case, the substrate is a silicon bulk substrate. In other implementations, the semiconductor substrate may be formed using alternate materials, which may or may not be combined with silicon, that include but are not limited to germanium, indium antimonide, lead telluride, indium arsenide, indium phosphide, gallium arsenide, or gallium antimonide. Further materials classified as group III-V or group IV materials may also be used to form the substrate. Although a few examples of materials from which the substrate may be formed are described here, any material that may serve as a foundation upon which a semiconductor device may be built falls within the spirit and scope of the claimed invention.

Figure 6:
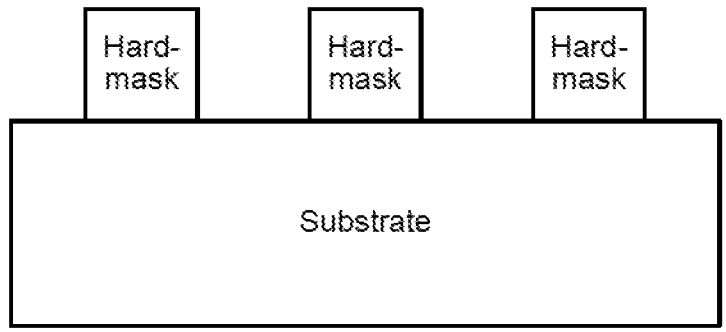

FIG. 6 illustrates deposition and patterning of a hardmask on the substrate of FIG. 5, in accordance with one embodiment of the present invention. This can be carried out using standard photolithography, including deposition of or more hardmask materials (e.g., such as silicon dioxide, silicon nitride, and/or other suitable hardmask materials), patterning resist on a portion of the hardmask that will remain temporarily to protect an underlying region of the fin (such as a diffusion or active area of a transistor device), etching to remove the unmasked (no resist) portions of the hardmask (e.g., using a dry etch, or other suitable hardmask removal process), and then stripping the patterned resist material, thereby leaving the patterned mask as shown. In one specific example embodiment, the resulting hardmask is a standard two-layer hardmask configured with a bottom layer of oxide and top layer of silicon nitride, and includes three locations (to provide three fins, in this example case), but in other embodiments, the hardmask may be configured differently, depending on the particular active device being fabricated. In one specific example embodiment having a silicon substrate, the hardmask is implemented with a bottom layer of native oxide (oxidation of silicon substrate) and top layer of silicon nitride. Any number of hardmask configurations can be used, as will be apparent.

Figure 7:
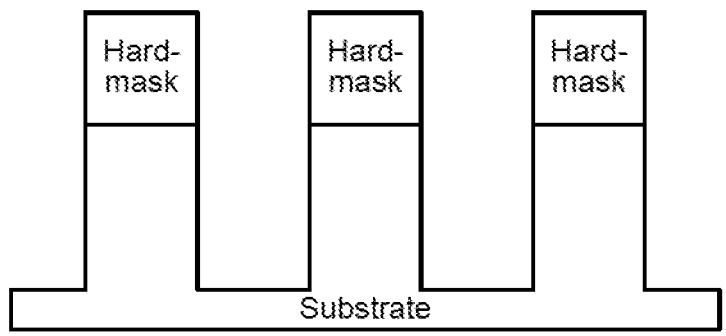

As can be seen in FIG. 7, shallow trenches are etched into the unmasked portions of the substrate. The shallow trench etch can be accomplished with standard photolithography include wet or dry etching, or a combination of etches if so desired. The geometry of the trenches (width, depth, shape, etc) can vary from one embodiment to the next as will be appreciated, and the claimed invention is not intended to be limited to any particular trench geometry. In one specific example embodiment having a silicon substrate and a two-layer hardmask implemented with a bottom oxide layer and a top silicon nitride layer, a dry etch is used to form the trenches that are about 100 Å to 5000 Å below the top surface of the substrate. Any number of trench configurations can be used, as will be apparent.

Figure 8:
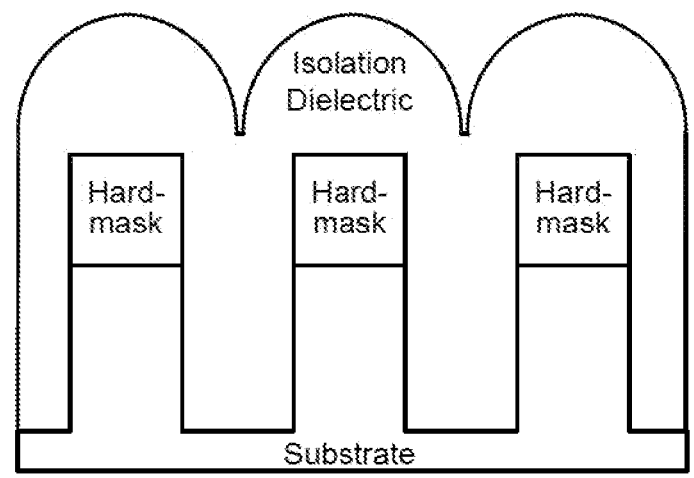

As can be seen in FIG. 8, the trenches are subsequently filled with an isolation dielectric material, using any number of standard deposition processes. In one specific example embodiment having a silicon substrate, the isolation dielectric material is $SiO_2$, but any number suitable isolation dielectric materials can be used to form the shallow trench isolation (STI) structures here. In general, the deposited or otherwise grown isolation dielectric material for filling the trenches can be selected, for example, based on compatibility with the native oxide of the substrate material. Note that the gate trench may be circular or polygonal in nature, and any reference to trench 'sides' is intended to refer to any such configurations, and should not be interpreted to imply a particular geometric shaped structure. For instance, trench sides may refer to different locations on a circular-shaped trench or discrete sides of a polygonal-shaped trench or even different locations on one discrete side of a polygonal-shaped trench. In a more general sense, trench 'surfaces' refers to all such trench sides as well as the base (bottom) of the trench.

Figure 9:
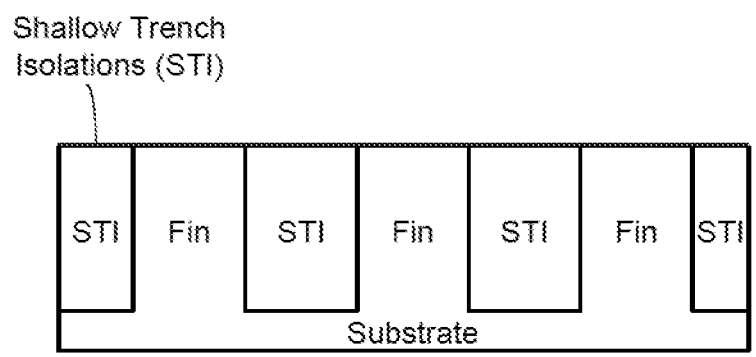

FIG. 9 demonstrates how the isolation dielectric is planarized using, for example, CMP or other suitable process capable of planarizing the structure. In the specific example embodiment shown, the hard mask can be completely removed, particularly over the fins intended for antifuse elements as described herein. Note, however, that such antifuse elements may be used in conjunction with other structures intended to function as a traditional transistor (transistors having an intended use that does not include exceeding the transistor's breakdown voltage). For these fins, the planarization can be carried out to leave a portion of the hardmask, which can be used as a gate passivation layer or oxide.

Figure 10:
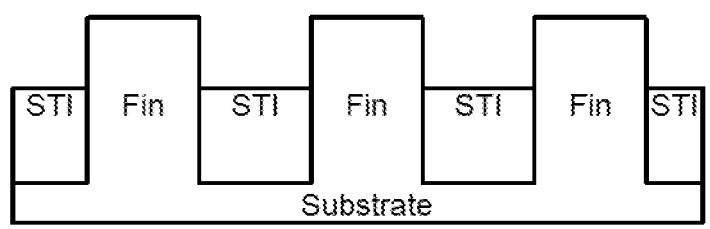

FIG. 10 demonstrates how the structure is further patterned, so that the isolation dielectric material in the STIs can be etched, so as to recess the STI isolation dielectric material below the fin structures. These recessed regions provide isolation for the source/drain regions of the transistor. The resulting structure can include any number of fins (one or more), isolated by any suitable isolation dielectric material.

This example fin structure depicted in FIGS. 5-10 is fabricated using photolithography as typically done. In other embodiments, note that the fins can be epitaxially grown as is sometimes done, such as described in U.S. Patent Application Publication No. 2008/0157130, titled, "Epitaxial Fabrication of Fins for FinFET Devices." In such cases, the fin is effectively formed as a layer in the manufacturing process. By forming a fin layer, fin thickness is determined through control of the process parameters used to form the fin layer rather than photolithographic processes. For instance, if the fin is grown with an epitaxial process, the fin's thickness will be determined by the growth dynamics of the epitaxy. FinFETs whose fill widths are determined through layer formulation rather than photolithography may offer improved minimum feature sizes and packing densities. In other embodiments, the fins can be fabricated by removal of material by cutting or ablation, for example, using laser, or other suitable tools capable of fine-cutting semiconductor materials. Resulting fin geometries will generally vary depending on formation techniques employed, as well as the desired thickness of the base region.

Figure 11:
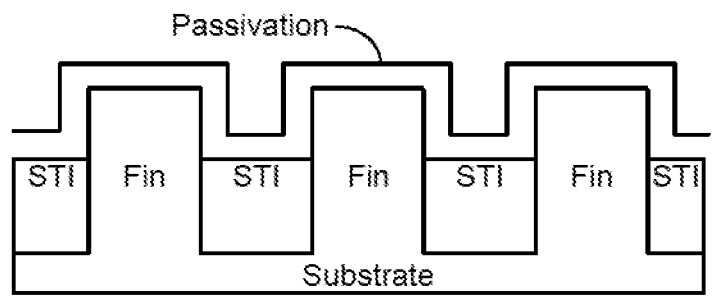

Once the fins are formed as described above or by any other suitable process, the method of FIG. 4 continues with depositing 403 a passivation onto fins and isolation dielectric as best shown in the example of FIG. 11. The passivation material is used to protect the substrate material from being consumed during the oxidation process, and can be, for example, an oxide or nitride. The passivation material may be formed using CVD, ALD, SOD, or PVD, or may be thermally grown. In one specific example embodiment, the passivation material is a CVD layer of silicon dioxide or silicon nitride that has a thickness in the range of 5 nm to 10 nm, although any thickness suitable to protect the underlying substrate during subsequent process can be used, as will be appreciated.

Figure 12:
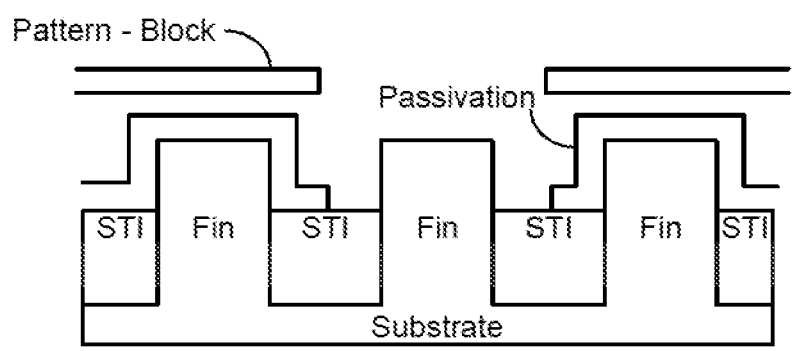

The method continues with patterning and etching 405 the passivation layer to expose one or more of the fins that will be used to form antifuse devices, as best shown in FIG. 12. As can be seen in this example embodiment, an etch block (photoresist) is provided over areas to be protected from the passivation etch. The etch block can be provided, for example, using standard lithography. In one such case, the lithography process generally includes forming a photoresist layer on the surface of the passivation layer, and then positioning a mask over the resist-coated area. The mask is configured with light non-transmissive (opaque) regions of chrome and light transmissive (transparent) regions of quartz. Radiation from a light source (e.g., ultra-violet or deep ultra-violet light, etc) and focused via an optical lens system is then applied to the mask. The light passes through the transparent mask regions and exposes the underlying photoresist layer, and is blocked by the opaque mask regions to leave those underlying portions of photoresist layer unexposed. Depending on the specific process used, either the exposed or non-exposed regions of photoresist layer can then be removed, thereby leaving a patterned resist layer on the passivation layer, which in turn allows for subsequent processing of the passivation layer (in this case, etching). The passivation etch can be carried out, for example, using dry or wet etch to remove the unblocked passivation material (e.g., oxide/nitride) layer. Thus, in this example case, some of the fins remain protected by the passivation layer after this passivation etch, and that those fins can subsequently be used for a non-antifuse purpose. In other embodiments, all of the fins can be used as antifuses if so desired. In such embodiments, note that the deposition, patterning, and etching of a passivation layer (e.g., as described at 403 and 405 of FIG. 4) can be eliminated or otherwise skipped as necessary.

Figure 13:
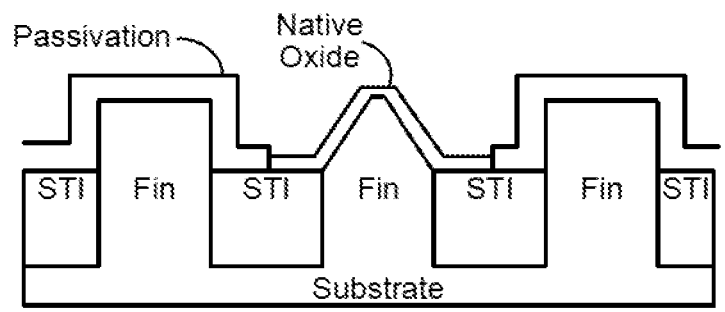

Once any desired patterning over the fins is completed, the method may continue with shaping the fin to provide areas of enhanced-emission sites which are suitable for use in lower voltage non-volatile antifuse memory elements. In this example embodiment, this shaping is carried out by conducting 407 a thermal oxidation process to consume fin material and provide the tapered fin shape, as best shown in FIG. 13. Any suitable oxidation process can be used, and the oxidation parameters will vary from one case to the next. For instance, the oxidation may be carried out at a temperature in the range of 500° C. to 1100° C. using oxygen only (dry oxidation) or oxygen and hydrogen (wet oxidation). The duration is dependent on the fin thickness desired, and can be as short as minutes at low temperatures (e.g., 500° C. to 800° C.) for very thin films (e.g., 50 Å to 500 Å) to hours at high temperatures (e.g., 800° C. to 1100° C.) for thick films (e.g., 500 Å to 1000 Å). The pressure may vary as well, and can be in the range anywhere from 0.1 to 25 atmospheres. In one specific example case, the oxidation of a silicon fin having an original thickness of about 100 Å to 150 Å is carried out using dry oxidation at atmosphere and a temperature of about 800° C. for 30 minutes to provide a tapered fin portion having a base region of about 95 Å and thin region of about 10 Å to 15 Å (not counting the thickness of the oxidation layer, which was subsequently removed via an etch process). Note that the consuming oxidation layer will not grow on the passivated surfaces, and will only grow on the exposed fin surfaces. The oxidation-based growth will consume the fin material (e.g., silicon or silicon germanium), creating a tapered fin shape. Recall that any number of tapered shapes can be provisioned.

Figure 14:
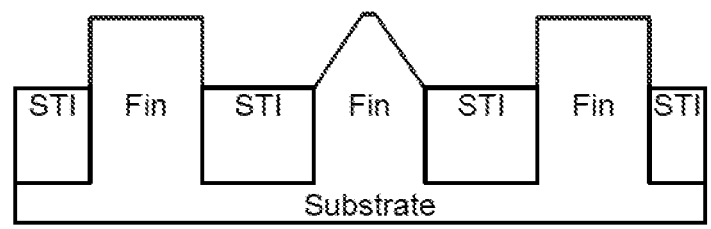

The method of this example embodiment then continues with stripping or otherwise removing 409 any remaining passivation layer and oxidation layer (using wet and/or dry etch processes) as shown in FIG. 14. In other embodiments, and as will be appreciated in light of this disclosure, note that the oxidation layer and/or the passivation layer can be implemented with the same materials (e.g., silicon dioxide or other native oxide), but need not be. Further note that the oxidation layer and/or the passivation layer can be left in place to function as the gate oxide, if so desired (in some cases, it may be more desirable to remove these layers and deposit a high-k dielectric gate dielectric).

Figure 15:
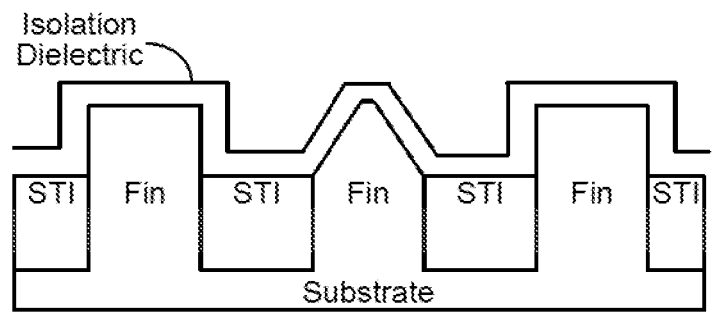
Figure 16:
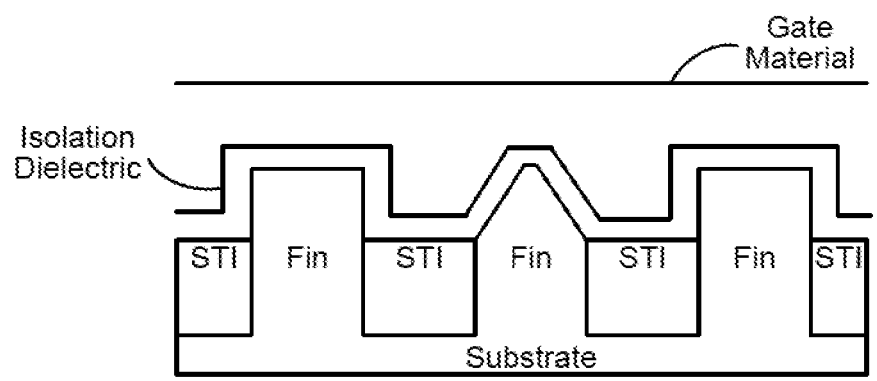

Assuming the oxidation and passivation layers are removed, the method of this example embodiment may further include providing 411 a desired isolation dielectric layer over fins, as best shown in FIG. 15. In one example case, the isolation dielectric material is an oxide that is either deposited or grown, such as silicon dioxide or a high-k oxide or a composite stack of both. Any suitable dielectric materials can be used. The method may then continue with standard processing and device fabrication, which may further include providing 413 gate material over the isolation dielectric, as shown in FIG. 16.

Any number of variations will be apparent in light of this disclosure. For instance, in other embodiments, the fin shaping can be done with etching or other suitable fin trimming/shaping processes (ablation, selective epitaxy, etc). In such cases, oxidation would not be necessary. Alternatively, a combination of oxidation and other shaping processes (e.g., etching, ablation, and/or selective epitaxy) can be used.

Example System

Figure 17:
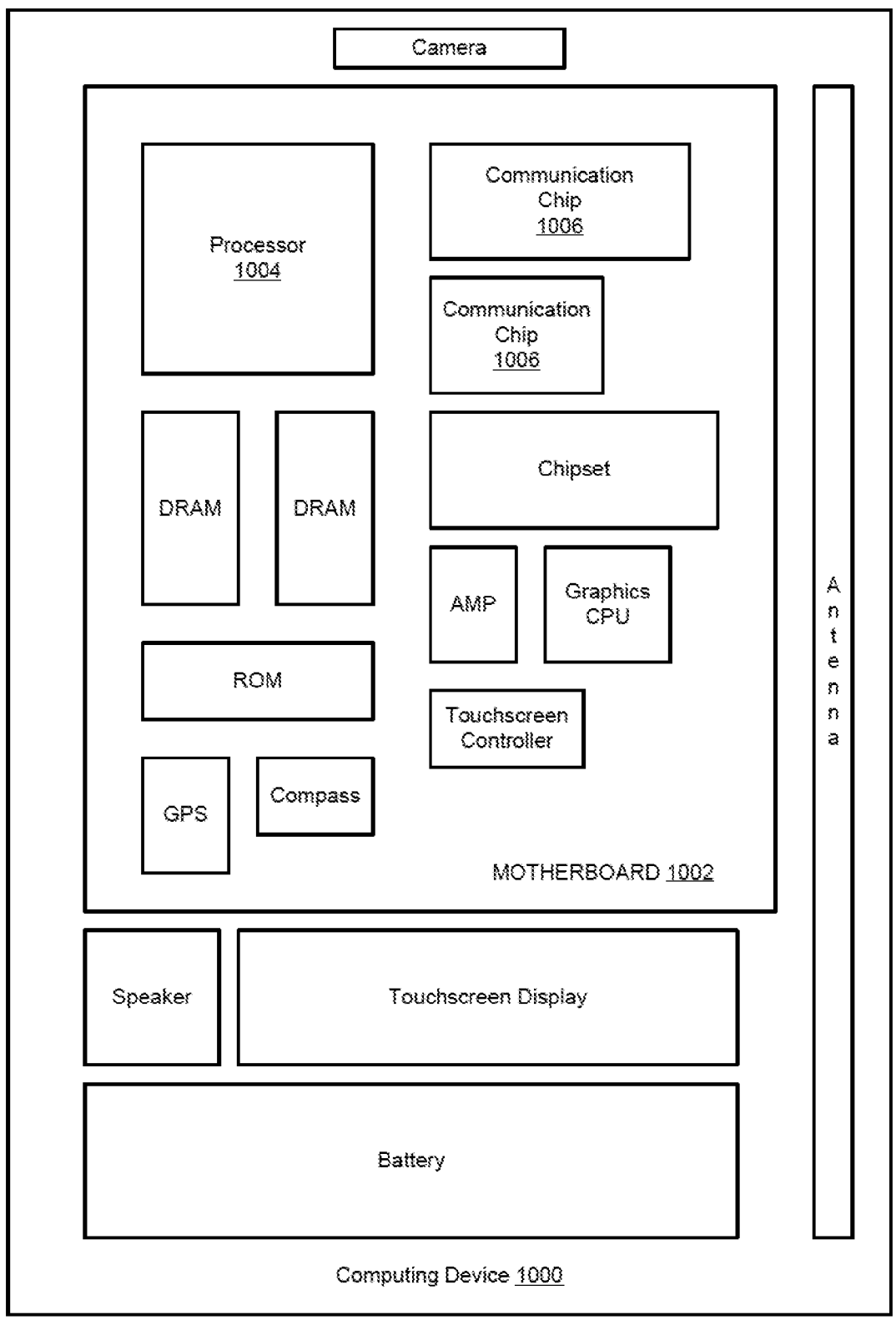
FIG. 17 illustrates a computing system implemented with one or more FinFET antifuse transistor structures in accordance with an example embodiment of the present invention.

FIG. 17 illustrates a computing device 1000 configured in accordance with one embodiment of the invention. As can be seen, the computing device 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of device 1000, etc. Depending on its applications, computing device 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing device 1000 may include one or more FinFET antifuse transistor structures as described herein. These antifuse structures can be used, for instance, to implement non-volatile memory, a calibrated or customized signal path, an enable/disable signal, or a circuit to select one of a plurality of redundant circuits that has passed an on-chip performance test (such as the case where multiple redundant circuits are provided on chip to improve yield). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LIE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some embodiments of the present invention, the integrated circuit die of the processor includes an onboard non-volatile memory or cache, and/or is otherwise communicatively coupled to off-chip memory that is implemented with one or more FinFET antifuse transistor structures as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more FinFET antifuse transistor structures as described herein (e.g., on-chip memory and/or other on-chip circuitry employing antifuse technology). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the device 1000 may be any other electronic device that processes data or employs antifuse devices.

Numerous embodiments will be apparent, and features described herein can be combined in any number of configurations. One example embodiment of the present invention provides a semiconductor antifuse device. The device includes a non-planar diffusion area having a fin configured with a tapered portion, a dielectric isolation layer on the fin including the tapered portion, and a gate material on the dielectric isolation layer. In one such case, the tapered portion of the fin includes a base region and a thinned region, and the thinned region is at least 50% thinner than the base region. In another such case, the thinned region is at least 75% thinner than the base region. In another such case, the thinned region is at least 90% thinner than the base region. In some cases, the non-planer diffusion area includes source and drain regions. In some cases, the non-planar diffusion area including the fin comprises silicon (e.g., silicon or silicon germanium, which may be doped to provide source and drain regions). In some cases, the dielectric isolation layer comprises a high-k dielectric material, and the gate material comprises polysilicon or metal. In some cases, the tapered portion comprises a plurality of thinned portions. In some cases, the tapered portion is formed by at least one of oxidation, etching, and ablation. In some cases, the antifuse device comprises one of a trigate or double-gate FinFET topology. Another embodiment provides an electronic device that includes a printed circuit board having one or more integrated circuits, wherein at least one of the one or more integrated circuits comprises one or more semiconductor antifuse devices as variously defined in this paragraph. In one such case, the one or more integrated circuits includes at least one of a communication chip and/or a processor, and at least one of the communication chip and/or processor comprises the one or more semiconductor antifuse devices. In another such case, the device is a computing device.

Another embodiment of the present invention provides a semiconductor device. The device includes at least one antifuse element, including a non-planar diffusion area having a fin configured with a tapered portion, a dielectric isolation layer on the fin including the tapered portion, and a gate material on the dielectric isolation layer. The device further includes at least one transistor element, including a non-planar diffusion area having an untapered fin. In some cases, the dielectric isolation layer is also on the untapered fin and the gate material is also on the dielectric isolation layer on the untapered fin. In some cases, the tapered portion of the fin includes a base region and a thinned region, and the thinned region is at least 50% thinner than the base region. In other such cases, the thinned region is at least 75% thinner than the base region. In other such cases, the thinned region is at least 90% thinner than the base region. In some cases, each of the non-planer diffusion areas includes source and drain regions. In some cases, the non-planer diffusion areas including the fins comprise silicon (e.g., the material making up the diffusion area and fins is the same material, except for any doping materials and any insubstantial residual material or materials). In some cases, the device comprises a plurality of the antifuse elements and/or a plurality of the transistor elements. In some cases, the tapered portion comprises a plurality of thinned portions. In some cases, the tapered portion is formed by at least one of oxidation, etching, and ablation (e.g., thermal oxidation plus a subsequent wet and/or dry etch to refine fin shape to provide a desired breakdown voltage). Another embodiment provides a computing device (e.g., smart phone or portable computer) that includes a printed circuit board having a communication chip and/or a processor, and at least one of the communication chip and/or processor comprises one or more semiconductor devices as variously defined in this paragraph.

Another embodiment of the present invention provides a semiconductor memory device. The device includes a non-planar diffusion area having a plurality of fins, at least one of the fins being configured with a tapered portion to provide an antifuse element. The device further includes a dielectric isolation layer on the fins. The device further includes a gate material on the dielectric isolation layer. Note that the device may include antifuse elements, fuse elements, and/or transistor elements, and other such elements and circuitry suitable for an integrated circuit memory (e.g., column and row select circuitry, sense/readout circuit, and power select circuitry to select between high and nominal voltages). The device may be included, for example, in one or more integrated circuits, or within a card containing additional circuitry, or in a system designed for carrying out a given function that requires memory. Another embodiment provides a computing device (e.g., mobile telephone or tablet computer) that includes the semiconductor memory device as defined in this paragraph.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A semiconductor antifuse device that can be short-circuited by applying a voltage across first and second terminals of the device, comprising:
    a bulk substrate;
    an insulation layer on the substrate;
    a fin extending from the substrate and through the insulation layer to a top of the fin, the fin configured with a tapered portion and including a channel region, a source region, and a drain region, wherein the tapered portion includes a base region that extends from the insulation layer and continues to a thinned region at the top of the fin, the thinned region being 75% or more thinner than the base region;
    a dielectric isolation layer over the channel region and on the fin including the tapered portion;
    a gate material on the dielectric isolation layer and including or electrically connected with the first terminal of the device; and
    source and drain contacts over the source and drain regions, respectively, the source and drain contacts including or electrically connected to the second terminal of the device.

2. The device of claim 1 wherein the tapered portion of the fin has an angular shape from the base region to the thinned region.

3. The device of claim 1 wherein the tapered portion of the fin has a curved shape from the base region to the thinned region.

4. The device of claim 1 wherein the tapered portion of the fin includes a base region and a thinned region, and the thinned region is at least 90% thinner than the base region.

5. The device of claim 1 wherein the source and drain regions comprise at least one of silicon and germanium.

6. The device of claim 1 wherein the fin is part of the bulk substrate and is silicon.

7. The device of claim 1 wherein the dielectric isolation layer comprises a high-k dielectric material, and the gate material comprises polysilicon or metal.

8. The device of claim 1 wherein the tapered portion comprises a plurality of thinned portions, each of which is 75% or more thinner than the base region.

9. The device of claim 1 wherein the tapered portion is formed by at least one of oxidation, etching, and ablation.

10. The device of claim 1 wherein the antifuse device comprises one of a frigate or double-gate FinFET topology.

11. An electronic device comprising:
    a printed circuit board having one or more integrated circuits, wherein at least one of the one or more integrated circuits comprises one or more semiconductor antifuse devices as defined in claim 1.

12. The electronic device of claim 11 wherein the one or more integrated circuits includes at least one of a communication chip and a processor, and at least one of the communication chip and processor comprises the one or more semiconductor antifuse devices.

13. The electronic device of claim 11 wherein the device is a mobile computing device.

14. A semiconductor device, comprising:
    at least one antifuse element, including the device of claim 1; and at least one transistor element, including an additional fin extending from the substrate and through the insulation layer to a top of the additional fin, wherein the top of the additional fin is thicker than the top of the tapered fin.

15. The device of claim 14 wherein the dielectric isolation layer is over a channel region of the additional fin and the gate material is on the dielectric isolation layer on the additional fin.

16. The device of claim 14 wherein the additional fin includes source and drain regions.

17. The device of claim 14 wherein the additional comprises silicon.

18. The device of claim 14 wherein the device comprises at least one of a plurality of the antifuse elements and a plurality of the transistor elements.

19. A computing device comprising:
a printed circuit board having at least one of a communication chip and a processor, and at least one of the communication chip and processor comprises one or more semiconductor devices as defined in claim 14.

20. A semiconductor memory device comprising an antifuse element that can be short-circuited by applying a voltage across first and second terminals of the element, the device comprising:
a bulk substrate;
an insulation layer on the substrate;
a plurality of fins, each fin extending from the substrate and through the insulation layer to a respective fin top and including a channel region, a source region, and a drain region, at least one of the fins being configured with a tapered portion to provide the antifuse element, wherein the tapered portion includes a base region that extends from the insulation layer and continuously tapers from the base region to a thinned region at the top of the fin, the thinned region being 75% or more thinner than the base region;
a dielectric isolation layer over each of the respective channel regions and on the fins;
a gate material on the dielectric isolation layer of the tapered fin and including or electrically connected with the first terminal of the antifuse element; and
source and drain contacts for source and drain regions, respectively, of the tapered fin, the source and drain contacts electrically connected to one another via the second terminal of the antifuse element.

21. A computing device comprising the semiconductor memory device of claim 20.

22. A semiconductor memory device comprising an antifuse element that can be short-circuited by applying a voltage across first and second terminals of the element, the device comprising:
a bulk substrate;
an insulation layer on the substrate;
a plurality of fins, each fin extending from the substrate and through the insulation layer to a respective fin top and including a channel region, a source region, and a drain region, at least one of the fins being configured with a tapered portion to provide the antifuse element, wherein the tapered portion of the fin includes a base region that extends from the insulation layer and continues tapering in an uninterrupted fashion to a thinned region at the top of the fin, and the thinned region is at least 75% thinner than the base region;
a dielectric isolation layer over each of the respective channel regions and on the fins, wherein the dielectric isolation layer comprises a high-k dielectric material;
a gate material on the dielectric isolation layer of the tapered fin, wherein the gate material comprises polysilicon or metal and includes or is otherwise coupled to the first terminal of the antifuse element; and
source and drain contacts for source and drain regions, respectively, of the tapered fin, the source and drain contacts electrically connected to or including the second terminal of the antifuse element.

23. A mobile computing device comprising the semiconductor memory device of claim 22.

\* \* \* \* \*